(12) United States Patent
Jorritsma et al.

(10) Patent No.: US 7,332,733 B2
(45) Date of Patent: Feb. 19, 2008

(54) SYSTEM AND METHOD TO CORRECT FOR FIELD CURVATURE OF MULTI LENS ARRAY

(75) Inventors: Laurentius Catrinus Jorritsma, Helmond (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 134 days.

(21) Appl. No.: 11/243,180

(22) Filed: Oct. 5, 2005

(65) Prior Publication Data

US 2007/0075278 A1 Apr. 5, 2007

(51) Int. Cl.
- G01N 21/86 (2006.01)
- G03B 27/52 (2006.01)
- G03B 27/72 (2006.01)
- G03B 27/32 (2006.01)
- G01J 3/28 (2006.01)
- G01B 11/10 (2006.01)

(52) U.S. Cl. .......................... 250/548; 355/55; 355/71; 355/77; 356/328; 356/401

(58) Field of Classification Search ................ 250/548, 250/204, 206.1–206.3, 208.1, 559.17, 559.18; 355/55, 67, 71, 53, 77; 359/224; 356/328, 356/401, 419

See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 7,081,947 B2 * | 7/2006 | Gui et al. ...................... 355/55 |
| 2001/0022691 A1 * | 9/2001 | Furter et al. ................. 359/629 |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

WO WO 98/33096 7/1998
WO WO 98/38597 9/1998

\* cited by examiner

*Primary Examiner*—Georgia Epps
*Assistant Examiner*—Don Williams
(74) *Attorney, Agent, or Firm*—Sterne, Kessler, Goldstein & Fox P.L.L.C.

(57) ABSTRACT

Focal plane errors across the field of an array of focusing elements are reduced by using a non-planar correction surface, shaped such that focal points of the focusing elements lie closer to a single plane than they would if the correction surface were planar. For example, this can be used when an array of focusing elements is used in a projection system of a lithography system.

21 Claims, 6 Drawing Sheets

SYSTEM AND METHOD TO CORRECT FOR FIELD CURVATURE OF MULTI LENS ARRAY

BACKGROUND

1. Field

The present invention relates to a lithographic apparatus, an array of focusing elements, a device manufacturing method, a method of improving an array of focusing elements and a method of setting up a lithographic apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

As a result of the continuing demand to form ever smaller features in devices, it is necessary to form ever smaller pattern features using lithographic techniques and with ever greater precision. Accordingly, it is necessary to control the position at which radiation is projected on to a substrate with ever greater precision.

Therefore, what is needed is a system and method that provide improved optical components that can be used in a lithographic apparatus.

SUMMARY

In an embodiment, there is provided a lithographic apparatus comprising a patterning device and projection system. The patterning device modulates a radiation beam. The projection system projects the modulated radiation beam onto a target portion of a substrate. The projection system comprises an array of focusing elements and a non-planar correction surface. The array of focusing elements are configured such that each focusing element focuses a portion of the modulated radiation beam onto the substrate. The non-planar correction surface is shaped such that, when the projection system projects the modulated radiation beam onto the substrate, the focal points of the focusing elements lie closer to a single plane than they would if the correction surface were planar.

In another embodiment, there is provided an array of focusing elements configured such that, when a radiation beam is incident on the array, each focusing element focuses a portion of the radiation beam to a respective focal point for a given wavelength of radiation. The array of focusing elements comprises a non-planar correction surface, shaped such that, when a radiation beam is incident on the array, the focal points of the focusing elements lie closer to a single plane than they would if the correction surface were planar.

In a further embodiment, there is provided a device manufacturing method comprising the following steps. Projecting a modulated radiation beam onto a substrate using a projection system comprising an array of focusing elements, configured such that each focusing element focuses a portion of the modulated radiation beam onto the substrate. Using a non-planar correction surface, shaped such that, when the projection system projects the modulated radiation beam onto the substrate, the focal points of the focusing elements lie closer to a single plane than they would if the correction surface were planar.

In a still further embodiment, there is provided a method of improving an array of focusing elements comprising the following steps. Measuring the position of the focal points of a plurality of the focusing elements when a radiation beam is incident on the array of focusing elements. Determining the shape of a non-planar correction surface required such that, when the correction surface is applied to the array of focusing elements, the focal points lie closer to a single plane than they did in the measuring step. Providing the array of focusing elements with a correction surface shaped according to the determining step.

In yet another embodiment, there is provided a method of setting up a lithographic apparatus having a projection system comprising an array of focusing elements, configured such that each focusing element focuses a portion of a modulated radiation beam onto a substrate, the method comprising the following steps. Measuring the position of the points to which a plurality of the focusing elements focus the respective portions of the modulated radiation beam. Determining the shape of a non-planar correction surface required such that, when the correction surface is included in the projection system, the points to which the focusing elements focus the respective portions of the modulated radiation beam lie closer to a single plane than they did in the measuring step. Providing the projection system with a correction surface shaped according to the determining step.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
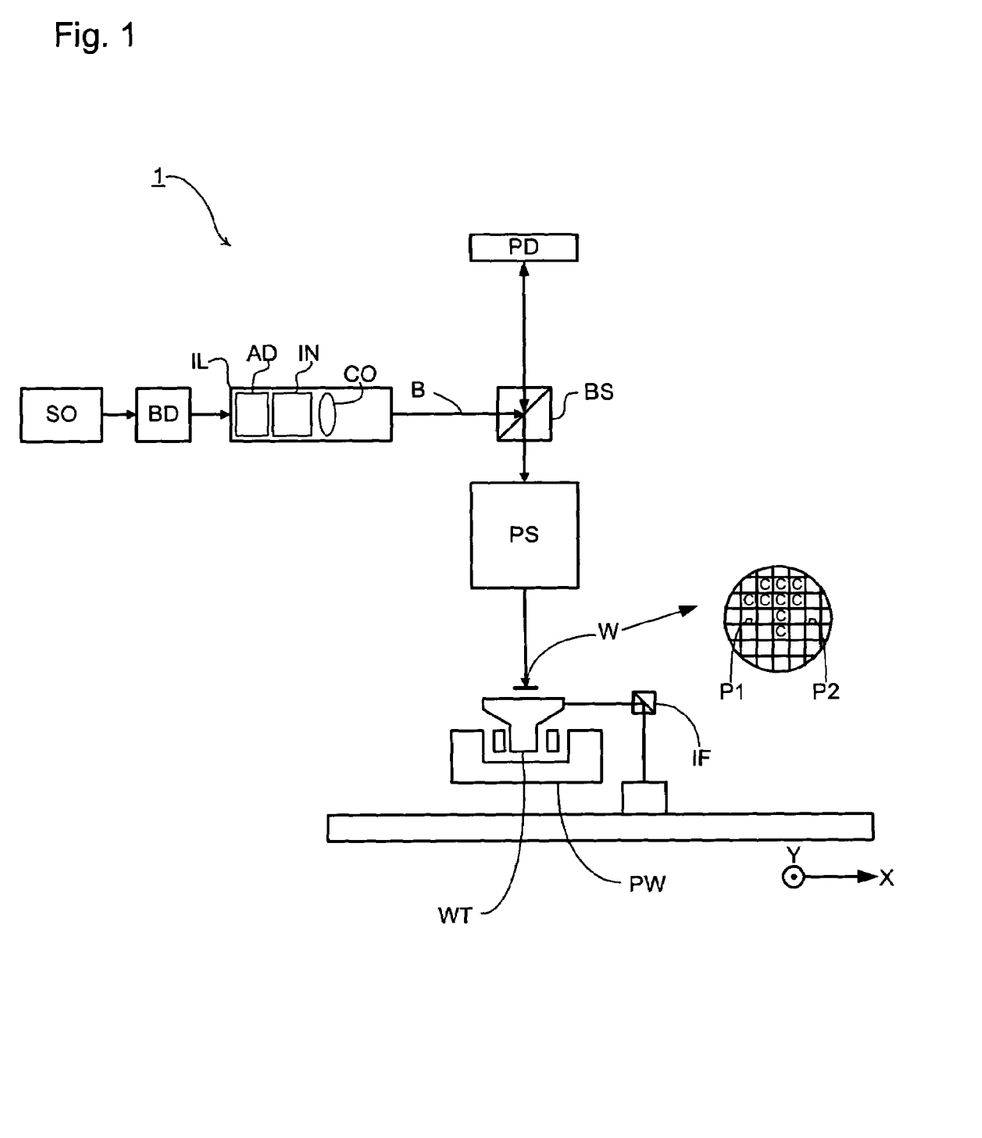
FIGS. 1 and 2 depict lithographic apparatus, according to various embodiments of the present invention.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate.

Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
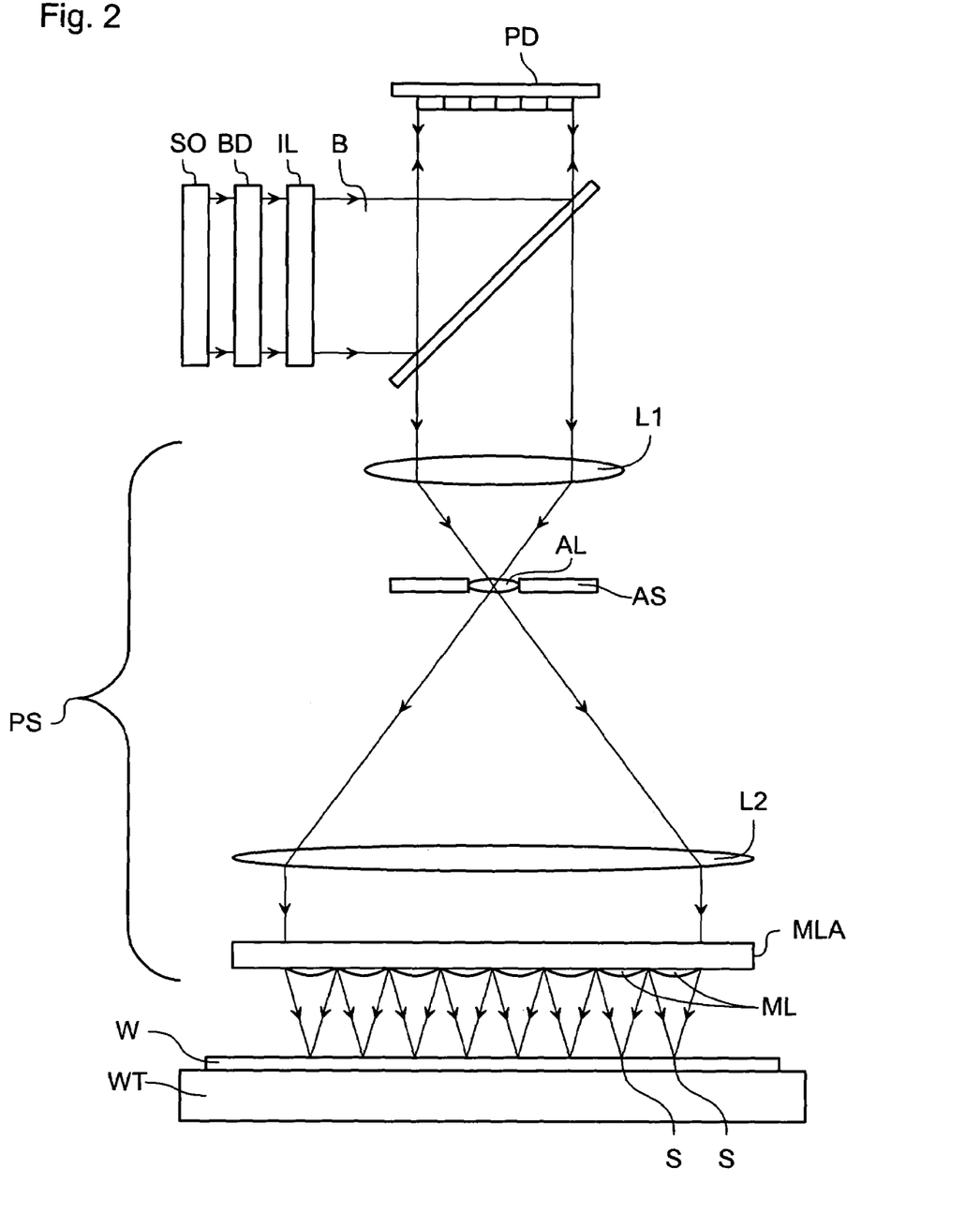

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These may be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
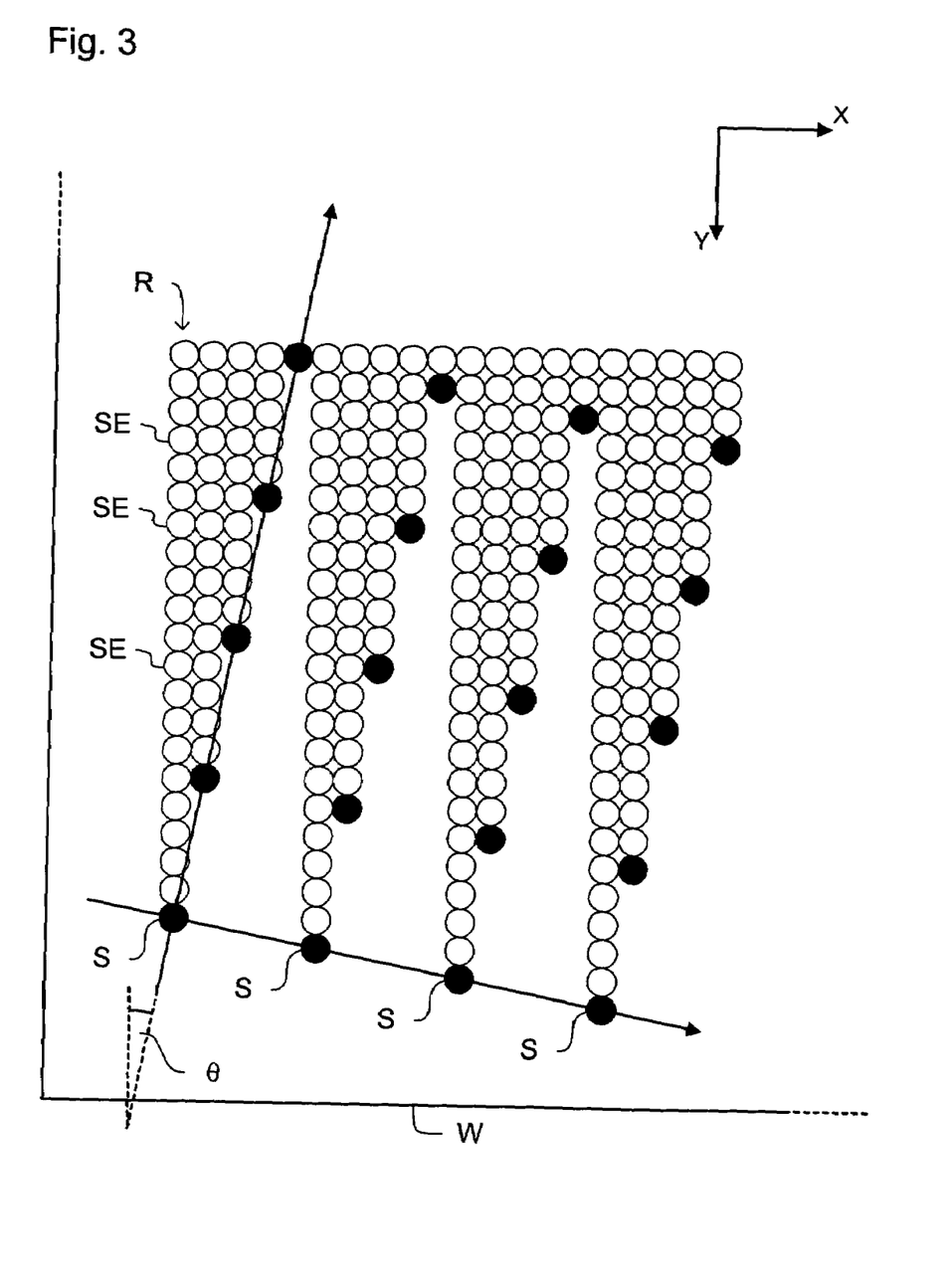
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
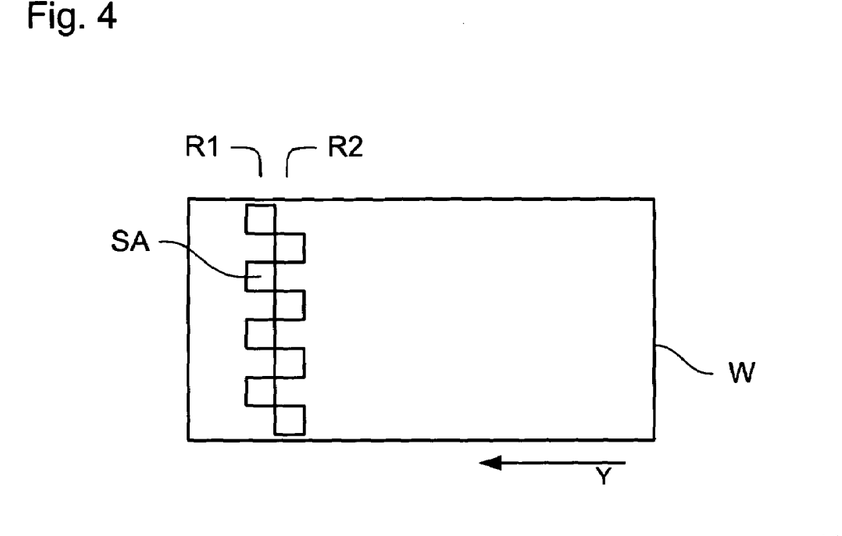
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

The inventors have determined that in a lithographic apparatus that includes an array of focusing elements in the projection system, for example, a significant proportion of the errors introduced by the projection system are caused by imperfections in the array of focusing elements. For example, curvature of the array of focusing elements can result in distortions of the plane of best focus of the radiation beam projected onto the substrate. These so-called focal plane errors can result in it being difficult to position the substrate relative to the projection system such that all parts of the radiation beam are optimally focused on the substrate. If, for example, the radiation beam is projected onto the substrate as an array of spots, as discussed above, the consequence of the focal plane errors is that not all of the spots can simultaneously be optimally focused on the substrate. Accordingly, it is not possible to ensure that all of the spots are as small as would otherwise be possible and, furthermore, the spot sizes vary across the array of spots. Variations in the spot size can result in corresponding variations in the intensity of the radiation received on the substrate. The larger the spot of radiation on the substrate, the lower the radiation intensity within that spot on the substrate.

As discussed above, the focusing elements within the array of focusing elements can be lenses. They can also be any other optical element capable of focusing a portion of the radiation beam such as, for example, parabolic reflectors. The array of focusing elements can, for example, be formed from a base plate having the focusing elements formed on the base plate, mounted on the base plate, or otherwise supported by the base plate and/or integrally formed with the base plate. The array of focusing elements can be formed by attaching the plurality of focusing elements to one another such that they support each other. Depending on the type of focusing element used, the base plate can be transparent to the radiation.

Figure 5A:
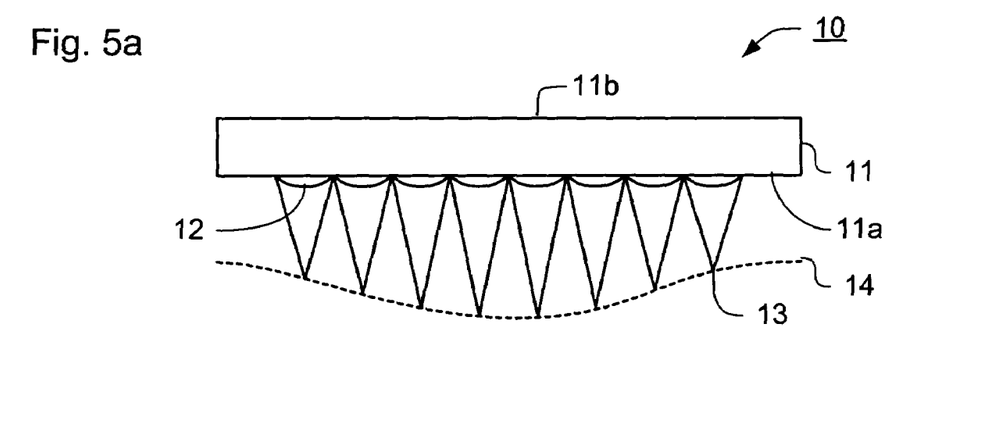
FIGS. 5a and 5b depict an optical element suitable for use in a lithographic apparatus and an improved optical element, according to one embodiment of the invention

FIG. 5a depicts an example of an array of focusing elements 10, according to one embodiment of the present invention. As shown, the array of focusing elements includes a base plate 11 and a plurality of lenses 12 formed on a first side 11a of the base plate 11. The base plate 11 may be substantially transparent to the radiation beam used. Accordingly, when radiation is incident on a second surface 11b of the base plate 11, the second surface 11b being on the opposite side of the base plate 11 to the first side 11a, the radiation is transmitted through the base plate 11 and focused by each of the lenses 12 to a corresponding focal point 13. As shown in the example shown in FIG. 5a, the focal points 13 associated with each of the lenses 12 do not lie in a single plane. Instead, as depicted, the focal points 13 lie on a non-planar surface 14. It will be appreciated that, in the depiction shown in FIG. 5a, the variation has been exaggerated and that, in practice, the variations may not be as large relative to the size of the array of focusing elements.

The focal plane errors that may be produced by the array of focusing elements (in the example shown in FIG. 5a, an array of lenses) can be caused by the process of forming the array of focusing elements. There are a plurality of methods for forming such arrays of focusing elements. For example, arrays of lenses can be formed by selectively etching a surface of a transparent base plate to form a plurality of cylindrically-shaped protrusions on the surface of the base plate. Subsequent heating of at least the protrusions on the base plate results in partial slumping of the protrusions under the effect of gravity. With sufficiently careful control of the heating, the slumping can be controlled such that the cylindrical protrusions slump into a desired shape such that each functions as a lens.

In a further example of the manufacture of an array of lenses, a layer of photo-active material is formed on a base plate and exposed to a pattern of radiation, and post-exposure processed as required, to form a plurality of cylindrically-shaped protrusions of resist material on the base plate. Subsequently, these protrusions can be heated to cause a controlled slump of the cylinders to form lenses from the protrusions, in a similar manner as that previously described.

Processes based on such controlled slumping are commonly referred to as reflow methods. Other methods of forming arrays of lenses include forming the array of lenses in a mould, embossing a base plate to form the lenses, etching and/or milling the required shapes. It should be appreciated that the present invention is not limited to use with arrays of focusing elements formed by one or more particular fabrication methods. Regardless of the method of manufacturing the array of focusing elements, some imperfection can be expected.

Figure 5B:
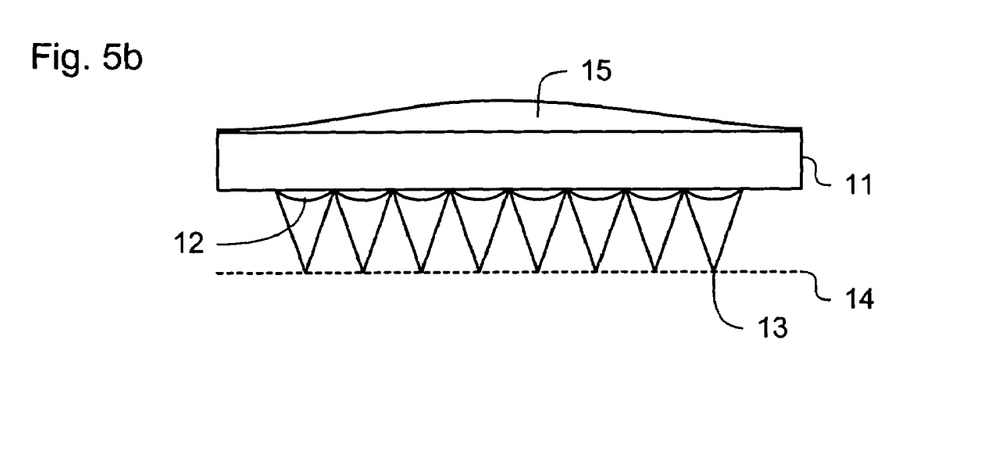

FIG. 5b depicts an array of focusing elements modified such that the focal plane errors can be reduced, according to one embodiment of the present invention. As shown, the array of focusing elements is provided with a correction surface 15. The correction surface 15 is shaped such that the new focal points 13' associated with each of the focusing elements (which are lenses in the example of FIGS. 5a and 5b) lie within a surface 14' that is closer to a plane. In other words, the surface 14' is closer to being planar. It will be appreciated that ideally the correction surface 15 is shaped such that the modified focal points 13' lie precisely within a single plane. However, due to limitations in the ability to accurately determine the shape required of the correction surface 15 and actually form it, this may not be possible. Accordingly, the correction surface 15 is shaped such that the modified focal points 13' associated with each focusing element lie closer to a single plane than they would if the correction surface were planar. It will be appreciated that there are a plurality of criteria that can be used to judge the extent to which a correction surface 15 improves the proximity of the focal points to a given plane. For example, the correction surface can be shaped in order to minimize the average separation between the focal points and a given plane. Additionally or alternatively, the correction surface 15 can be shaped in order to minimize the maximum separation between any focal point and the given plane. Additionally or alternatively, the correction surface 15 can be selected to minimize the standard deviation of the separation between the focal points and the given plane.

Additionally or alternatively, the correction surface 15 can be selected to minimize the difference between two opposite edges of the array of focusing elements. Depending on the configuration of the lithographic apparatus, portions of a substrate exposed by radiation focused onto the substrate by the focusing elements on one side of the array of focusing elements can be adjacent portions of the substrate exposed by radiation focused onto the substrate by the focusing elements on the opposite side of the array of focusing elements, for example, in a later exposure or at a later stage of a continuous exposure. If there are significant differences between the distribution of the focal points corresponding to the focusing elements on a first side of the array of focusing elements and the distribution of the focal point corresponding to the focusing elements on the opposite side of the array of focusing elements, a discontinuity in the pattern formed can be generated at the boundary between the adjacent areas on the substrate exposed by the different sides of the array of focusing elements. Due to the repeating nature of the exposure system, such a discontinuity can be repeated across the substrate, resulting in pattern artifacts that can be severely detrimental to the functioning of the device being formed. Accordingly, it can be desirable to form the correction surface 15 specifically to minimize the differences between the distribution of the focal points of the focusing elements on either side of the array of focusing elements.

The correction surface can be prepared specifically to correct errors introduced by the array of focusing elements. In this case, for example, the array of focusing elements can be inspected in isolation to measure the position of the focal points of the focusing elements. From this, it is possible to determine the shape required for the correction surface in order that the focal points lie closer to a single plane than they would if the correction surface were planar. Subsequently, the correction surface can be provided to the array of focusing elements to form an improved array of focusing elements.

It should be appreciated that the process can be iterative, such that the array of focusing elements with a correction surface is inspected in order to determine an improved shape for the correction surface. The improved correction surface can then be applied to the array of focusing elements and the process repeated as required until the array of focusing elements has been improved to the required extent. It should further be appreciated that, when the position of the focal points of the focusing elements is measured, all of the focal points can be measured or a sample of the focal points can be measured. A sample can be used, for example, if the variation is known or expected to vary in a consistent manner across the array. In this case, only measuring a sample can increase the speed of the process without significantly reducing its effectiveness.

It will be appreciated that the correction surface can additionally be used to correct imperfections introduced by other components in an apparatus, such as a lithographic apparatus, in which the array of focusing elements is to be used and/or imperfections introduced by the interaction between the array of focusing elements and other components within such an apparatus. Accordingly, the measurement of the position of the focal points (either all of the focal points or a sample) can be performed once the array of focusing elements has been installed in the apparatus. It will be appreciated that if, for example, the array of focusing elements does not directly project the radiation onto the substrate, the measurement of the variation of the position of the focal points relative to an optimum plane can be performed at substrate level.

The shape of the correction surface can be determined in order to improve the imperfections inherent in the array of focusing elements alone or to improve the imperfections in the array of focusing elements as installed. In either case, the process can be performed when the array of focusing elements or the apparatus to which it is installed, is being formed or subsequently during the lifetime of the array of focusing elements or apparatus to which it is installed. For example, in the case of an array of focusing elements used in a lithographic apparatus, the deviations of the focal points relative to an optimum plane can be periodically inspected and, if the deviations change and/or become larger than an acceptable level, the correction surface can be replaced with a new correction surface and/or can be modified. Likewise, it will be appreciated that a correction surface according to the invention can be provided to an array of focusing elements or lithographic apparatus employing an array of focusing elements that was initially formed without such a correction surface.

It will also be appreciated that the focal point for each focusing element can be different for different wavelengths of radiation. Accordingly, the determination of the required shape of the correction surface can be performed for one or more particular wavelengths and/or for a particular range of wavelengths of radiation. For example, in the case of an array of focusing elements used in a lithographic apparatus, the determination of the required shape of the correction surface can be performed for the wavelength of radiation that the lithographic apparatus projects onto the substrate.

It should be also be appreciated that it can be possible to identify a shape for the correction surface that improves the proximity of the focal points to the optimum focal plane for a plurality of different wavelengths of radiation even if the optimum focal plane for each of the wavelengths is different. For example, a single shape of a correction surface can result in radiation of a first wavelength being focused to a plurality of focal points lying sufficiently close to a first plane and radiation of a second wavelength being focused to a plurality of focal points lying sufficiently close to a second plane, different to the first plane.

EMBODIMENT 1

Figure 6A:
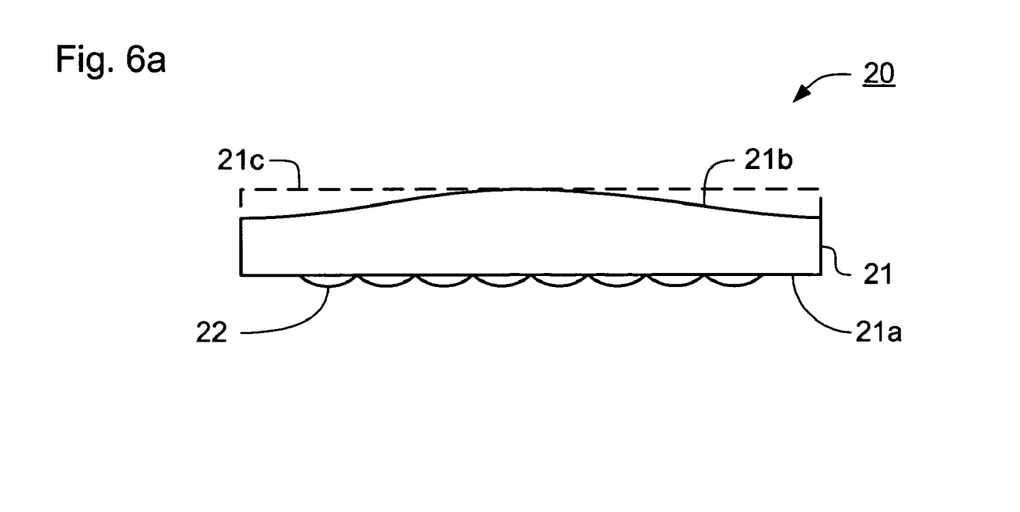
FIGS. 6a, 6b and 6c depict exemplary embodiments for implementing the improvement depicted in FIGS. 5a and 5b.

FIG. 6a depicts a first arrangement that can be used to provide a correction surface, according to one embodiment of the present invention. As shown, the array of focusing elements 20 includes a base plate 21. A plurality of lenses 22 are mounted, formed, or otherwise arranged on a first side 21a of the base plate 21. The base plate 21 can be formed from a material that is substantially transparent to the radiation used in conjunction with the array of focusing elements. The correction surface is applied to a second side 21b of the base plate 21. The second side 21b is on the opposite side of the base plate 21 to the first side 21a. The correction surface can be formed, for example, by polishing, etching or milling the original surface 21c on the second side 21b of the base plate 21.

EMBODIMENT 2

Figure 6B:
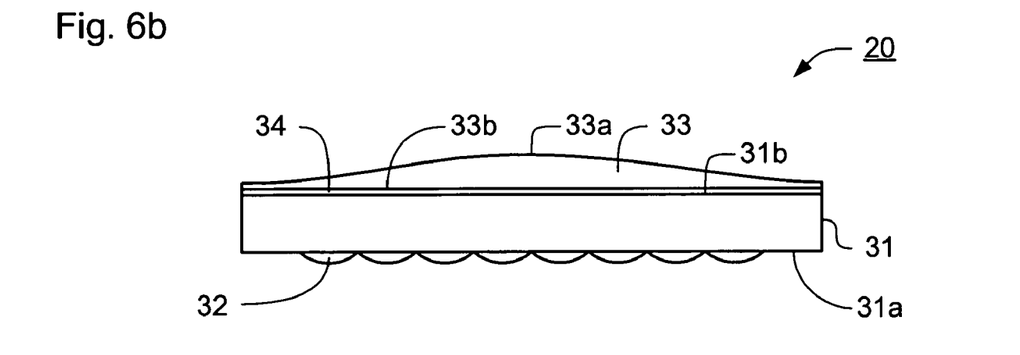

FIG. 6b depicts a second arrangement by which a correction surface can be applied to an array of focusing elements, according to another embodiment of the present invention. As shown, the array of focusing elements 30 includes a base plate 31. On a first side of the base plate 31a a plurality of lenses 32 are formed, mounted, or otherwise arranged. The base plate 31 can be substantially transparent to the radiation being used. The correction surface 33a is formed on a first side of a correction plate 33. The correction plate 33 can also be formed from a material that is substantially transparent to the radiation being used. The correction plate can be formed from a material having the same coefficient of thermal expansion as the base plate 31. Accordingly, any heating of the array of focusing elements, such as can occur during use, will not result in differing amounts of expansion of the base plate 31 and the correction plate 33, resulting in relative movement of at least a part of the correction surface relative to the array of focusing elements and/or stresses within the components. The material for the correction plate 33 can be selected such that it has substantially the same refractive index as the material of the base plate 31. Accordingly, reflections of radiation at the boundary between the base plate 31 and the correction plate 33 can be minimized. The correction plate 33 can be formed from the same material as the base plate 31.

The correction surface 33a is formed on a first side of the correction plate 33. A second side 33b of the correction plate 33, on the opposite side of the correction plate 33 to the correction surface 33a, is bonded to a second side 31b of the base plate 31 (the second side 31b of the base plate being arranged on the opposite side of the base plate 31 to the first side 31a of the base plate). The shapes of the second side 31b of the base plate and the second side 33b of the correction plate can conform, such that the separation between the base plate 31 and the correction plate 33 is minimized across the plates. In particular, the second side 31b of the base plate and the second side 33b of the correction plate can be planar.

The bonding used to secure the correction plate 33 to the base plate 31 can be any bonding suitable for this use. The bonding can, for example, be a layer of adhesive 34. Alternatively or additionally, the base plate 31 and the correction plate 33 can, for example, be heated and pressed together to form a weld. Alternatively or additionally, the correction plate 33 can be joined to the base plate 31 by means of a bonding technique known as "ansprengen." In this technique, the two surfaces are polished until they are sufficiently free of deformations and/or contamination that, when they are put together, the surfaces become connected by direct crystal bonding.

Where a material, such as an adhesive 34, is required between the base plate 31 and the correction plate 33 to form the bond, such a material can, depending on the thickness of the material used, be selected to be substantially transparent to the radiation being used. The material can alternatively or additionally be selected such that the refractive index of the material is similar to at least one of the base plate 31 and the correction plate 33 in order to minimize the reflection of the radiation at the boundaries between the material and the base plate and the correction plate. Alternatively or additionally, the material can be selected such that, if required, the bonding can later be removed. This would subsequently permit the correction plate to be removed and either replaced or modified being re-attached to the base plate 31.

EMBODIMENT 3

Figure 6C:
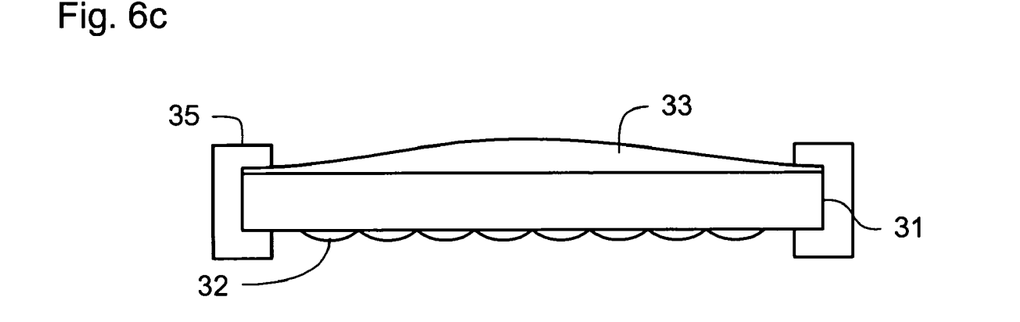

FIG. 6c depicts a further arrangement by which a correction surface can be applied to an array of focusing elements, according to yet another embodiment of the present invention. This arrangement is similar to that described above in relation to the embodiment shown in FIG. 6*b*, and the corresponding description will not be repeated. In this arrangement, the bonding between the base plate 31 and the correction plate 33 is replaced by a fastening. In the example shown, the fastening is one or more clamps 35 that hold the correction plate 33 to the base plate 31. It will be appreciated that alternatively or additionally other fastenings, such as bolts and/or magnetic clamps and/or vacuum clamping can be used. Such an arrangement can facilitate the removal of the correction plate, for example for replacement or modification. Such an arrangement can, for example, permit the correction plate 33 to be removed, while the array of focusing elements is mounted to the remainder of the apparatus in which it is to be used. The fastening can be arranged such that the position of the correction plate 33 relative to the base plate 31 can be modified. This can permit improved alignment accuracy of the correction plate 33 relative to the base plate 31 and/or modification of the alignment of the correction plate 33 relative to the base plate 31 once the array of focusing elements has been mounted to the apparatus in which it is being used.

Although, as described above and as shown in FIG. 6*c*, the correction plate 33 can be fastened to the base plate 31 of the array of focusing elements, the correction plate 33 can be mounted at a position set apart from the base plate. This can facilitate removing the correction plate, for modification or replacement, without interfering with the array of individually controllable elements. It will be appreciated that, in this case, the correction surface will be selected appropriately.

EMBODIMENT 4

Figure 7:
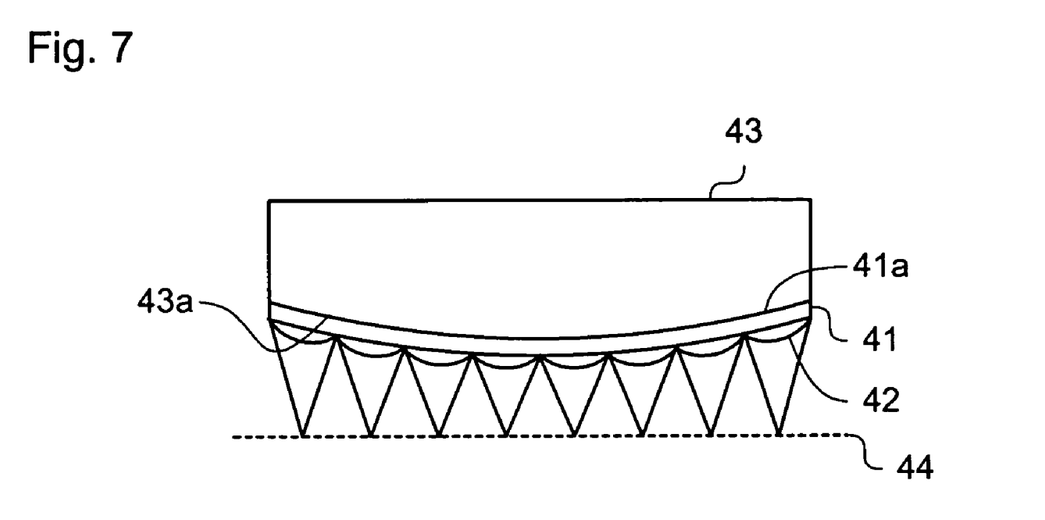
FIG. 7 depicts a further embodiment for implementing the invention.

FIG. 7 depicts a further arrangement by which a correction surface can be applied to an array of focusing elements, according to yet another embodiment of the present invention. As shown, the base plate 41 which supports the focusing elements 42 to form the array of focusing elements is relatively thin in comparison to the thickness of a correction plate 43. The correction plate 43 has a correction surface 43*a* to which the base plate 41 is connected. In particular, a side 41*a* of the base plate 41, opposite the side on which the focusing elements 42 are connected, mounted or otherwise supported, is connected to the correction surface 43*a* such that the base plate 41 of the array of focusing elements deforms to conform to the shape of the correction surface 43*a*. The resulting deformation of the array of focusing elements adjusts the relative position of the focal points 45 corresponding to the focusing elements such that they are lie closer to a given plane 44.

The base plate 41 can be connected to the correct plate 43 by any of the methods discussed above, including boding with an adhesive, welding, direct crystal bonding ("ansprengen"), and/or depending on the shape of the correction surface, fastening by means of one or more of clamps, bolts, magnetic clamps and vacuum clamping.

EMBODIMENT 5

According to another embodiment of the present invention, a correction surface can alternatively or additionally be applied to another component in an apparatus in which an array of focusing elements is being used rather than to the array of focusing elements itself. For example, where an array of individually controllable elements is being used in the projection system of a lithographic apparatus (such as shown in FIG. 2), the correction surface can be applied to other components within the projection system. For example, one or more of the surfaces of the optical components L1, AL, L2 in the projection system can be modified to incorporate the correction surface. Alternatively or additionally, an additional optical element can be introduced to the projection system, incorporating the correction surface. Such an arrangement can be particularly beneficial for use in conjunction with an array of reflective focusing elements. This can be required, for example, for apparatus that operates with radiation, such as EUV radiation, which is readily absorbed by most materials and, accordingly, usually used in conjunction with reflective optical elements. In such an arrangement, a correction surface can readily be applied to an existing reflector within the projection system, namely the shape of the existing reflector can be modified. Alternatively or additionally, one or more additional reflective elements can be included in the projection system, including the correction surface.

Although specific reference can be made in this text to the use of lithographic apparatus in the manufacture of a specific device (e.g. an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:

a patterning device that modulates a radiation beam; and a projection system that projects the modulated radiation beam onto a target portion of a substrate, the projection system comprising, an array of focusing elements, configured such that each focusing element in the array of focusing elements focuses a portion of the modulated radiation beam onto the substrate,
wherein the array of focusing elements comprises a non-planar correction surface that is shaped such that focal points of the focusing elements lie closer to a single plane than they would if the correction surface were planar.

2. The lithographic apparatus of claim 1, wherein the array of focusing elements comprises:
a base plate that is substantially transparent to the radiation beam; and
an array of lenses on a first side of the base plate,
wherein a second side of the base plate, opposite the first side, is shaped to form the non-planar correction surface.

3. The lithographic apparatus of claim 1, wherein the array of focusing elements comprises:
a plurality of focusing elements supported by a base plate; and
a correction plate, on which the non-planar correction surface is formed.

4. The lithographic apparatus of claim 3, wherein the correction plate is bonded to the base plate.

5. The lithographic apparatus of claim 4, wherein:
the base plate and the correction plate are substantially transparent to the radiation beam;
the focusing elements are lenses on a first side of the base plate; and
the correction plate is bonded to a second side of the base plate, opposite the first side.

6. The lithographic apparatus of claim 3, wherein the correction plate is connected to the base plate by fasteners.

7. The lithographic apparatus of claim 6, wherein:
the base plate and the correction plate are substantially transparent to the radiation beam;
the focusing elements are lenses on a first side of the base plate;
the non-planar correction surface is formed on a first side of the correction plate; and
the correction plate is fastened to the base plate, such that a second side of the base plate, opposite the respective first side, and a second side of the correction plate, opposite the respective first side, are held against each other.

8. The lithographic apparatus of claim 3, wherein the base plate is connected to the correction surface, such that the base plate deforms to conform to the shape of the correction surface.

9. The lithographic apparatus of claim 3, wherein the base plate and the correction plate have a substantially same coefficient of thermal expansion.

10. The lithographic apparatus of claim 3, wherein the base plate and the correction plate have a substantially same refractive index.

11. An array of focusing elements, comprising:
a non-planar correction surface shaped such that, when a radiation beam is incident on the array of focusing elements, respective focal points of each focusing element in the array of focusing elements lie closer to a single plane than they would if the correction surface were planar,
wherein each of the focusing elements focuses a portion of the radiation beam to the respective focal point for a given wavelength of radiation.

12. A device manufacturing method, comprising:
projecting a modulated radiation beam onto a substrate using a projection system comprising an array of focusing elements having a non-planar correction surface; and
using each focusing element in the array of focusing elements to focus a portion of the modulated radiation beam onto the substrate;
wherein the non-planar correction surface that is shaped such that focal points of the focusing elements lie closer to a single plane than they would if the correction surface were planar.

13. A flat panel display manufactured according to the method of claim 12.

14. An integrated circuit device manufactured according to the method of claim 12.

15. A method, comprising:
measuring a position of focal points of an array of focusing elements when a radiation beam is incident on the array of focusing elements;
determining a shape of a non-planar correction surface, based on the measuring step, such that when the correction surface is applied to the array of focusing elements, the focal points lie closer to a single plane than they did in the measuring step; and
providing the array of focusing elements with the correction surface shaped according to the determining step.

16. The method of claim 15, further comprising:
forming the array of focusing elements, comprising,
providing a base place that is substantially transparent to the radiation beam; and
coupling an array of lenses on a first side of the base plate;
wherein the step of providing the array of focusing elements with the correction surface comprises forming the shape on a second side of the base plate, opposite the first side.

17. The method of claim 15, wherein the step of providing the array of focusing elements with the correction surface comprises:
forming the shape on a correction plate; and
attaching the correction plate to the array of focusing elements.

18. A method of configuring a lithographic apparatus having a projection system comprising an array of focusing elements, such that each focusing element focuses a respective portion of a modulated radiation beam onto a substrate, comprising:
measuring positions of points to which the array of focusing elements focus the respective portions of the modulated radiation beam;
determining a shape of a non-planar correction surface, such that when the correction surface is applied to the array of focusing elements, the points to which the focusing elements focus the respective portions of the modulated radiation beam lie closer to a single plane than they did in the measuring step; and
providing the array of focusing elements with the correction surface shaped according to the determining step.

19. The method of claim 18, wherein the array of focusing elements comprises:
a base plate that is substantially transparent to the modulated radiation beam; and
an array of lenses on a first side of the base plate,
wherein the step of providing the projection system with the correction surface comprises forming the shape on a second side of the base plate, opposite the first side.

20. The method of claim 18, wherein the step of providing the array of focusing elements with the correction surface comprises:
    forming the shape on a correction plate; and
    installing the correction plate in the array of focusing elements.

21. The method of claim 20, wherein installing the correction plate the comprises attaching the correction plate to the array of focusing elements.

* * * * *

UNITED STATES PATENT AND TRADEMARK OFFICE
CERTIFICATE OF CORRECTION

PATENT NO.        : 7,332,733 B2                                          Page 1 of 1
APPLICATION NO.   : 11/243180
DATED             : February 19, 2008
INVENTOR(S)       : Jorritsma et al.

It is certified that error appears in the above-identified patent and that said Letters Patent is hereby corrected as shown below:

Column 22
line 2, please replace "correction plate the comprises" with --correction plate comprises--.

Signed and Sealed this

First Day of July, 2008

JON W. DUDAS
*Director of the United States Patent and Trademark Office*